US008735922B2

(12) United States Patent
Tsai

(10) Patent No.: US 8,735,922 B2
(45) Date of Patent: May 27, 2014

(54) LED MIRROR LIGHT ASSEMBLY

(76) Inventor: Chien-Tsai Tsai, New Taipei (TW)

(*) Notice: Subject to any disclaimer, the term of this patent is extended or adjusted under 35 U.S.C. 154(b) by 186 days.

(21) Appl. No.: 13/192,558

(22) Filed: Jul. 28, 2011

(65) Prior Publication Data

US 2013/0026512 A1 Jan. 31, 2013

(51) Int. Cl.
*H01L 33/00* (2010.01)
*F21V 33/00* (2006.01)

(52) U.S. Cl.
USPC .......... 257/98; 257/88; 257/81; 257/E33.001; 257/E33.067; 257/E33.068; 362/139; 362/140; 362/141; 362/249.02; 362/257

(58) Field of Classification Search
USPC .......... 257/79, 81, 88, 98, E33.001, E33.067, 257/E33.068, E33.072; 52/785.1, 785.11, 52/785.12; 132/102, 316, 304; 359/214, 359/838, 839, 840, 842; 362/109, 135, 136, 362/137, 140, 141, 142, 139, 145, 241, 362/249.01, 249.02, 249.11, 257, 296.09, 362/311.02
See application file for complete search history.

(56) References Cited

U.S. PATENT DOCUMENTS

| | | | | |
|---|---|---|---|---|
| 4,922,384 | A * | 5/1990 | Torrence | 362/611 |
| 5,040,102 | A * | 8/1991 | Bengert | 362/125 |
| 2002/0080463 | A1* | 6/2002 | Tonar et al. | 359/267 |

FOREIGN PATENT DOCUMENTS

| | | | |
|---|---|---|---|
| CN | 20153789 | * 6/2010 | A47G 1/00 |
| CN | 202480750 | * 10/2012 | A47G 1/00 |

* cited by examiner

*Primary Examiner* — Cuong Q Nguyen
*Assistant Examiner* — Galina Yushina
(74) *Attorney, Agent, or Firm* — Rosenberg, Klein & Lee

(57) ABSTRACT

A LED mirror light assembly comprises a body having a through hole configured subject to a predetermined shape and located on a middle part thereof, a film-coated glass configured subject to shape of the through hole and supported on a first step, a LED holder holding a plurality of light-emitting diodes, and a reflector comprising a reflective surface located on a front side thereof and facing toward the light-emitting diodes and a light-shading coating coated on a rear side thereof The reflector being kept in a non-parallel manner relative to the film-coated glass and defining with the film-coated glass a predetermined contained angle so that the light spots of the light-emitting diodes are repeatedly reflected by the reflective back face of the film-coated glass and the reflective surface of the reflector, forming a curved tunnel of light spots.

3 Claims, 10 Drawing Sheets

LED MIRROR LIGHT ASSEMBLY

BACKGROUND OF THE INVENTION

1. Field of the Invention

The present invention relates to a mirror light assembly and more particularly, to a LED mirror light assembly, which provides a visual effect of curved tunnel of light spots by means of a non-parallel arrangement of two opposing reflective surfaces.

2. Description of the Related Art

Mirror and lighting fixture are requisite devices commonly used in our daily life. A mirror is an object having a planar reflective surface for reflecting light. Normally, a mirror comprises a flat glass and a reflective metal coating coated on the back side of the flat glass for reflecting the image of a person or object.

Further, a coated glass is a glass member coated with one or multiple layers of metal, metal alloy or metal oxide coating to modify the optical performance of the glass. It is intensively used in building construction, vehicles and other objects, and can be made to provide different characteristics and to fit different requirements. For example, when a glass member is coated with chrome, titanium, stainless steel or their compound, the coated glass member will be light transmissive to visible light, reflective to infrared light and absorptive to ultraviolet light. Further, when a glass member is coated with silver, copper, tin or their compound, the coated glass member will be light transmissive to visible light and reflective to infrared light.

FIG. 1 illustrates a LED mirror light 60 constructed according to Taiwan Patent Publication No. M377916, which comprises a mirror frame 61 holding a plurality of LEDs (not shown) therein, a mirror glass 62 having a front mirror surface 621 and a light-shading coating coated on the center area of the back side thereof and a transissive portion 622 arranged between the front mirror surface 621 and the mirror frame 61 for outgoing of light emitted by the LEDs. Thus, the LED mirror light 60 works as a mirror as well as a lighting fixture.

The aforesaid LED mirror light 60 is simply the combination of a mirror and a lighting fixture together without providing any unexpected function. There is room for improvement. It is desirable to provide a mirror light that provides a visual effect and can be used as an ornamental art.

SUMMARY OF THE INVENTION

The present invention has been accomplished under the circumstances in view. It is the main object of the present invention to provide a mirror light assembly, which combines a mirror, a lighting fixture, an art ornament and a special visual effect into a unit.

A LED mirror light assembly comprises a body, a film-coated, and a LED holder set. The body includes a through hole configured subject to a predetermined shape and located on a middle part thereof, and a first step and a second step disposed around the through hole and extending outwardly in a direction from a front side of the body toward a rear side thereof A film-coated glass configured subject to shape of the through hole and supported on the first step. The film-coated glass comprises a transmittance front face and a reflective back face. A LED holder set in between the first step and the second step and holding a plurality of light-emitting diodes. The LED holder comprises a front frame wall, a rear frame wall and a peripheral frame wall connected between the front frame wall and the rear frame wall and holding the light-emitting diodes. A reflector mounted at the rear frame wall of the LED holder. The reflector comprises a reflective surface located on a front side thereof and facing toward the light-emitting diodes and a light-shading coating coated on a rear side thereof The reflector being kept in a non-parallel manner relative to the film-coated glass and defining with the film-coated glass a predetermined contained angle so that the light spots of the light-emitting diodes are repeatedly reflected by the reflective back face of the film-coated glass and the reflective surface of the reflector, forming a curved tunnel of light spots.

According to the above-mentioned features, in one embodiment, the front frame wall and the rear frame wall of the LED holder are arranged in a non-parallel manner and define therebetween the predetermined contained angle so that the reflector and the film-coated glass are kept in a non-parallel manner defining the predetermined contained angle therebetween. In another embodiment, the second step of the body has two opposite sides sloping at different angles so that when the reflector is mounted at the second step, the reflector is kept in a non-parallel manner relative to the film-coated glass defines with the film-coated glass the contained angle.

By means of the aforesaid arrangement to utilize two opposing, non-parallel reflective surfaces for reflecting light spots, the LED mirror light assembly can be used as a lighting fixture as well as a mirror and can provide a visual effect of curved tunnel of light spots.

BRIEF DESCRIPTION OF THE DRAWINGS

The file of this Patent contains at least one Drawing Figure executed in color. Copies of the Patent with color Drawings will be provided by the Patent and Trademark Office upon request and payment of the necessary fee.

FIG. 5 is a schematic drawing of the present invention, illustrating the

LEDs turned on.

Figure 5:
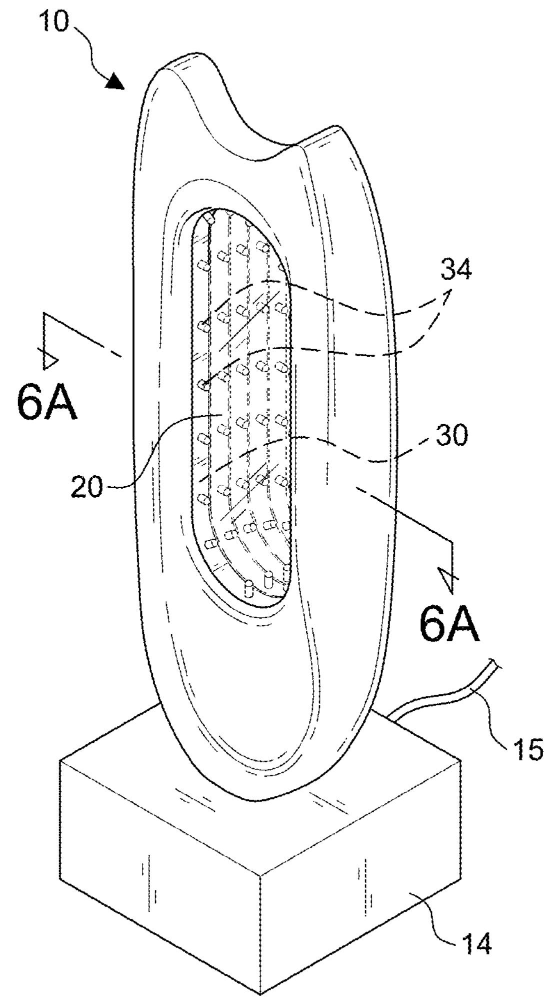
Figure 6A:
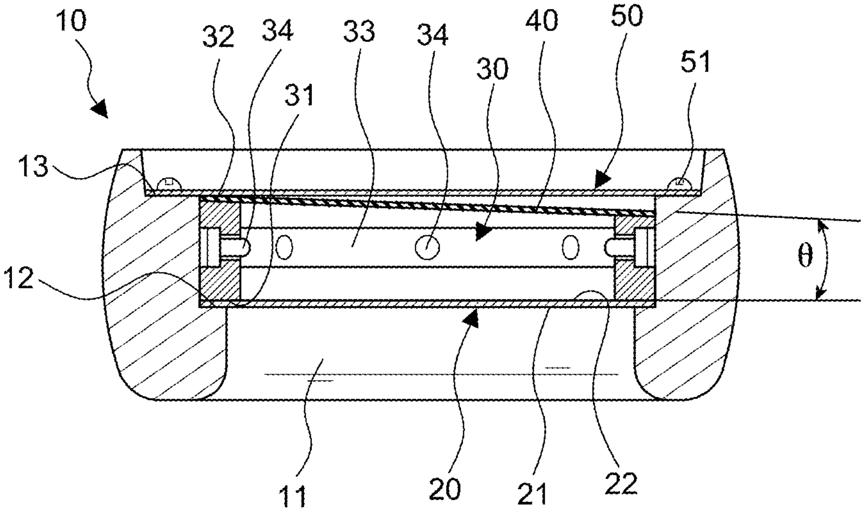

FIG. 6A is a sectional view taken along line 6A-6A of FIG. 5.

Figure 6B:
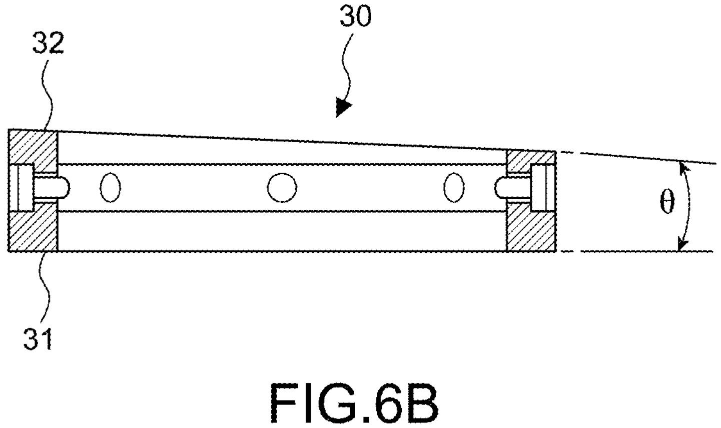

FIG. 6B is a partially enlargement view of FIG. 6A.

Figure 7A:
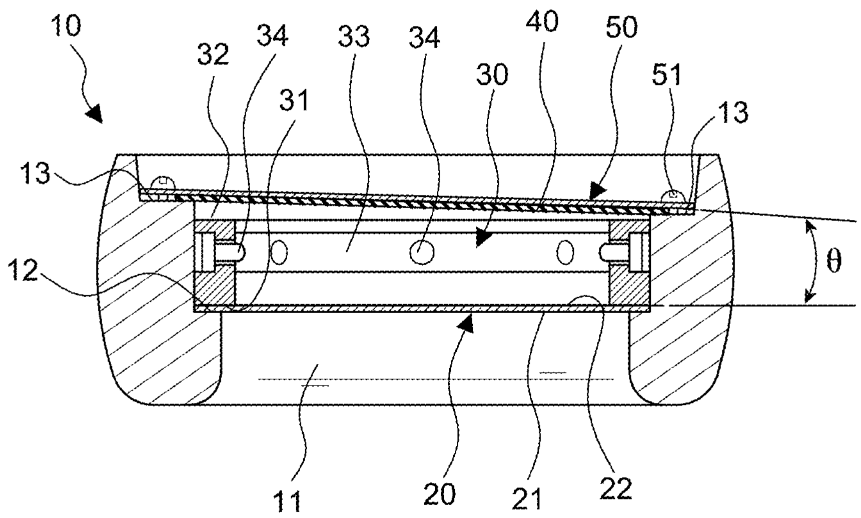

FIG. 7A is a schematic sectional view of an alternate form of the LED mirror light assembly in accordance with the present invention.

Figure 7B:
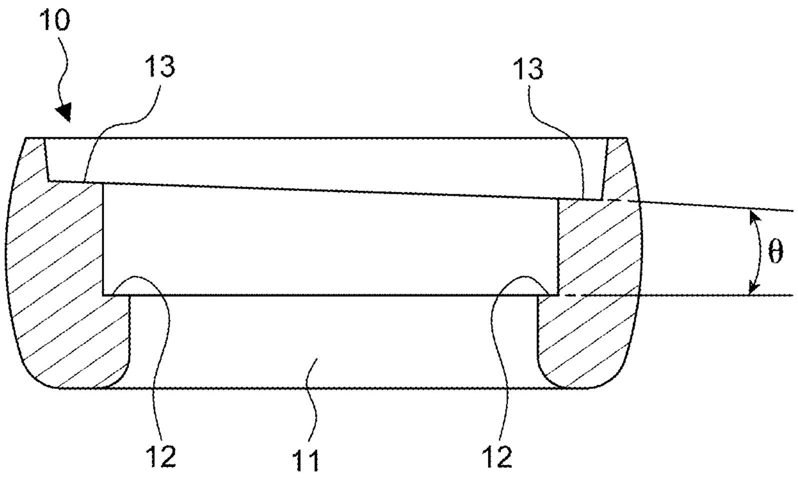

FIG. 7B is an partially enlargment view of FIG. 7A.

Figure 8:
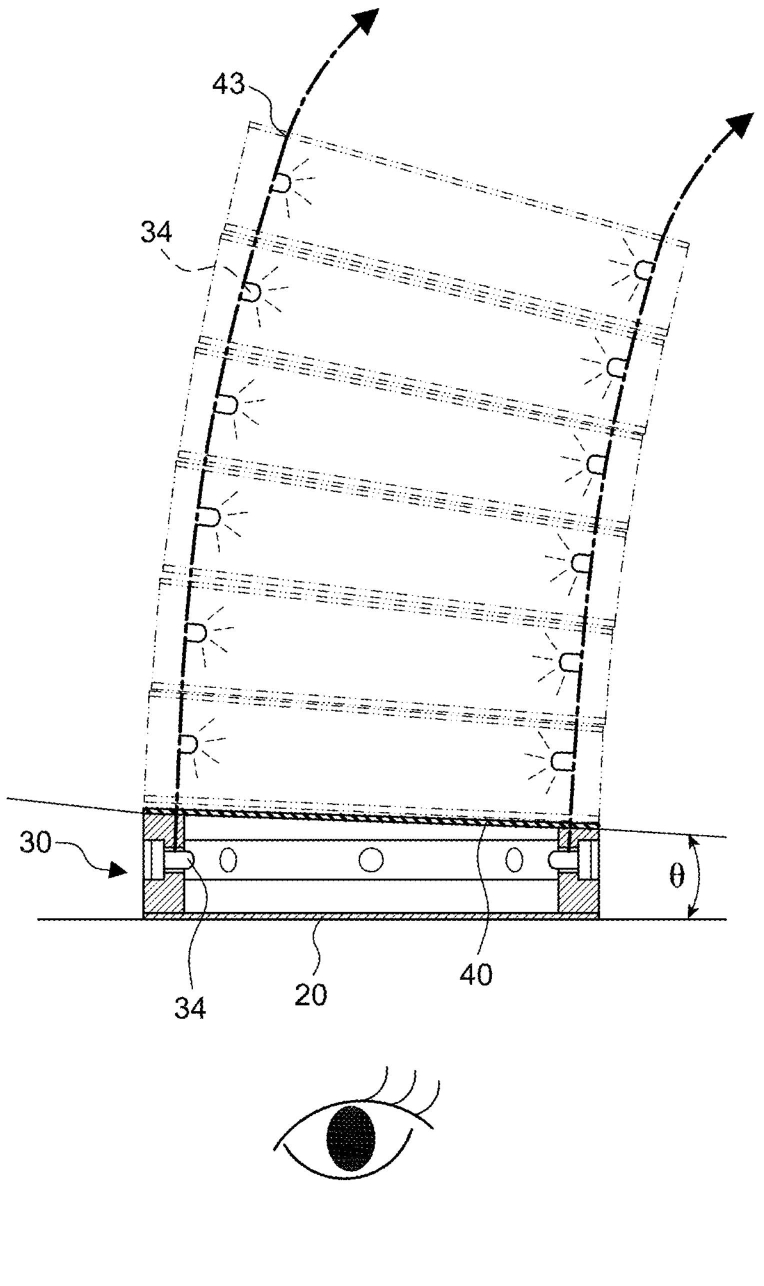

FIG. 8 is a schematic drawing illustrating a light source reflection condition of the present invention.

Figure 9:
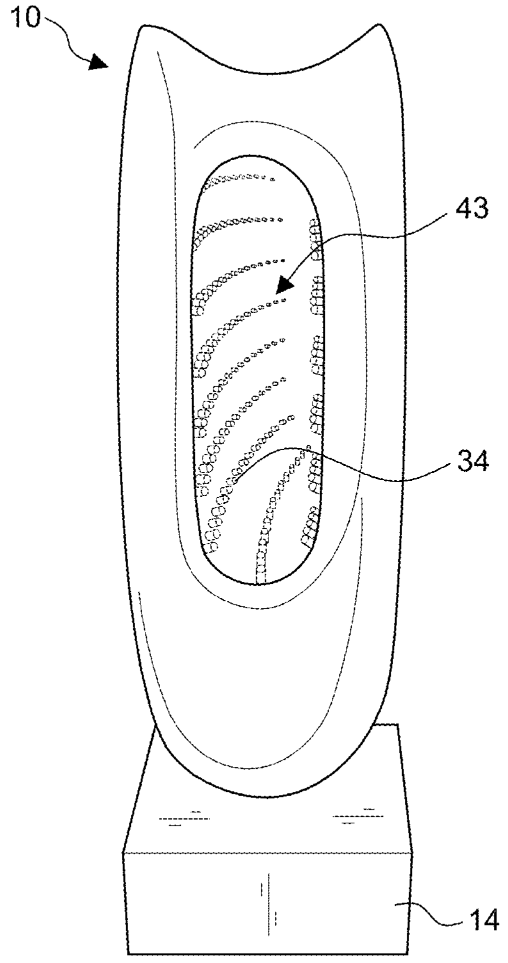

FIG. 9 is a schematic front applied view illustrating an operation status of the present invention.

Figure 10:

FIG. 10 is a original colored picture of the present invention.

DETAILED DESCRIPTION OF THE PREFERRED EMBODIMENT

Figure 1:
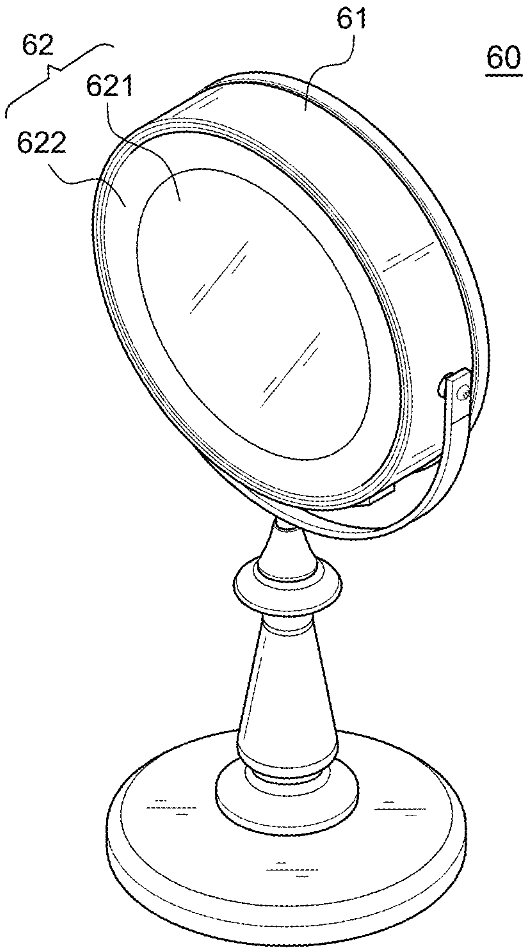
FIG.1 PRIOR ART
FIG. 1 is an oblique elevation of a mirror light according to the prior art.
Figure 2:
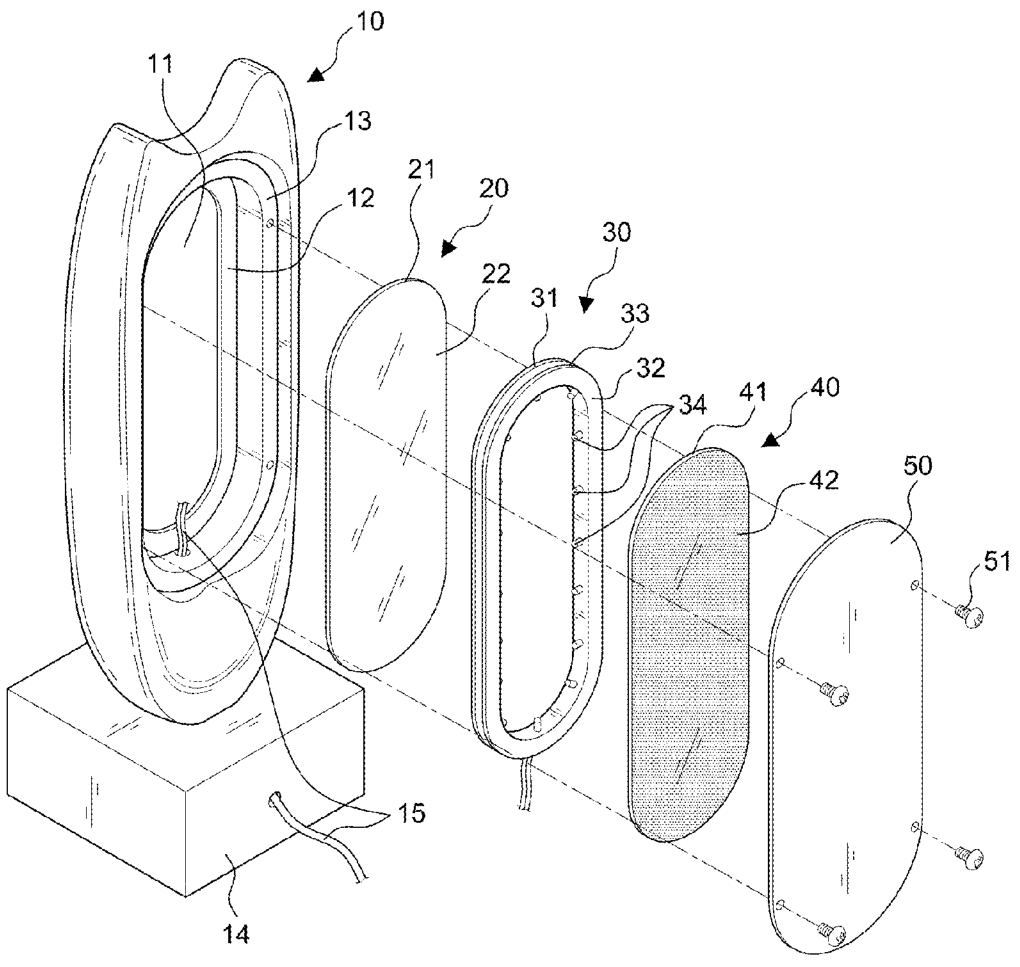
FIG. 2 is an exploded view of the LED mirror light assembly in accordance with the present invention.
Figure 3:
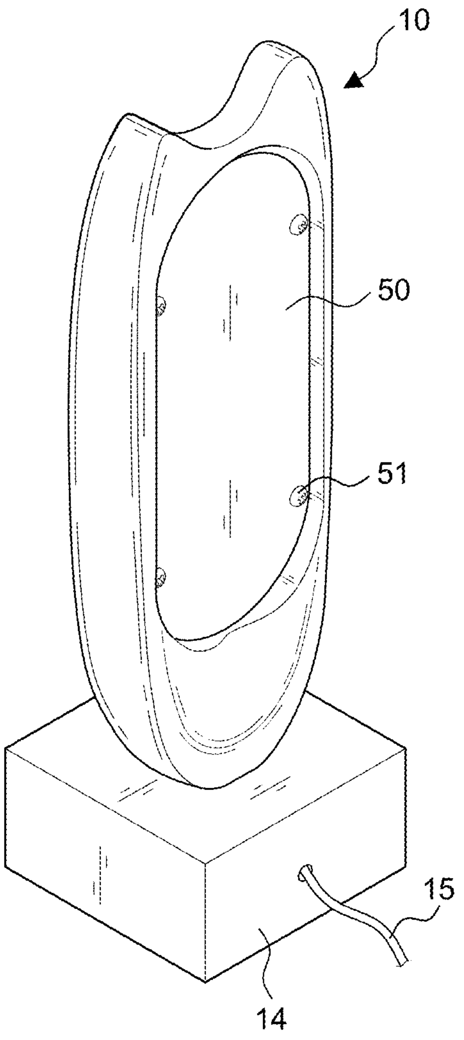
FIG. 3 is a rear elevation of the LED mirror light assembly in accordance with the present invention.
Figure 4:
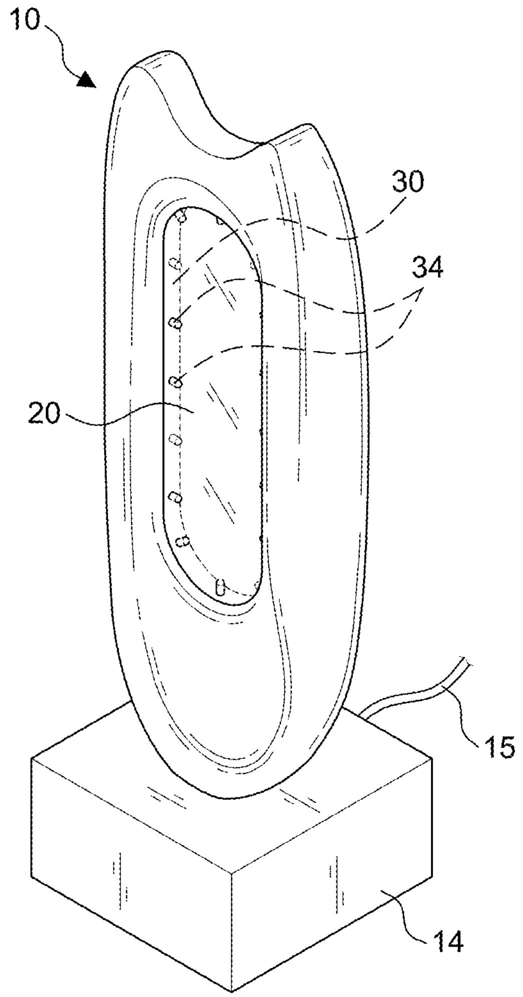
FIG. 4 is a front elevation of the LED mirror light assembly in accordance with the present invention.

Referring to FIGS. 2 to 6, a LED mirror light assembly in accordance with the present invention comprises a body 10, a film-coated glass 20, the LED holder 30, the reflector 40 and a backboard 50. The body 10 configured subject to a predetermined pattern, as illustrated in FIG. 2, having a through hole 11 located on the middle in a predetermined shape, for example, oval shape and extending through opposing front and rear sides thereof, a first step 12 and a second step 13 disposed around the through hole 11 and extending outwards in a direction from the front side toward the rear side at different elevations for accommodating a film-coated glass 20, the LED holder 30, the reflector 40 and a backboard 50. Besides, a base 14 arranged at the bottom side of the body 10, and a power cord 15 inserted through the base 14 into the inside of the body 10.

The film-coated glass 20 being a metal film-coated semi-transmissive semi-reflective glass member configured subject to the configuration of the through hole 11 and supported on the first step 12, having a transmittance front face 21 and a reflective back face 22. The LED holder 30 being a hollow frame set in between the first step 12 and the second step 13 and arranged at the reflective back face 22 of the film-coated glass 20, having a front frame wall 31, a rear frame wall 32 and a peripheral frame wall 33 connected between the front frame wall 31 and the rear frame wall 32 and holding a plurality of LEDs (light-emitting diodes) 34 at the peripheral frame wall 33. The reflector 40 mounted at the rear frame wall 32 of the LED holder 30, having a reflective surface 41 located on the front side thereof and facing toward the LEDs 34 and a light-shading coating 42 coated on the back side thereof Further, the reflector 40 and the film-coated glass 20 are arranged in a non-parallel manner, as illustrated in FIG. 6A, defined therebetween a contained angle θ so that the light spots of the LEDs 34 are repeatedly reflected by the reflective back face 22 of the film-coated glass 20 and the reflective surface 41 of the reflector 40, forming a curved tunnel of light spots 43.

As stated above, the film-coated glass 20 and the reflector 40 are arranged in a non-parallel manner, defining therebetween a contained angle θ. According to this embodiment, as illustrated in FIGS. 6A and 6B, the front frame wall 31 and the rear frame wall 32 are arranged in a non-parallel manner, defining therebetween a contained angle θ so that the film-coated glass 20 and the reflector 40 are kept in a non-parallel manner with a contained angle 0 defined therebetween. Further, a backboard 50 is arranged at the second step 13 of the body 10 and attached to the rear side of the reflector 40. According to this embodiment, screws 51 are used to affix the backboard 50 to the reflector 40.

FIGS. 7A and 7B illustrate an alternate form of the present invention. According to this embodiment, the second step 13 of the body 10 has two opposite sides sloping at different angles so that when the reflector 40 is mounted at the second step 13, it is kept in a non-parallel manner relative to the film-coated glass 20, and therefore a contained angle 0 is defined between the film-coated glass 20 and the reflector 40.

Referring to FIG. 8, by means of the aforesaid technique measure to have the film-coated glass 20 and the reflector 40 be arranged in a non-parallel manner with a contained angle θ defined between and with the semi-transmissive semi-reflective film-coated glass 20 disposed at the front side relative to the reflector 40, the light spots of the LEDs 34 are repeatedly reflected by the reflective back face 22 of the film-coated glass 20 and the reflective surface 41 of the reflector 40 to form a curved tunnel of light spots 43, showing a three-dimensional lighting pattern. If the reflective back face 22 of the film-coated glass 20 and the reflective surface 41 of the reflector 40 are arranged in a parallel manner, the reflected light spots will be overlapped, without showing a three-dimensional pattern of curved tunnel of light spots 43, as illustrated in FIG. 9. With the reference of FIG. 10, the LED mirror light on the left side shows LEDs turn off as a mirror, and on the right side shows LEDS turn on providing the visual effect of the aforesaid curved tunnel of light spots Another requisite technical feature of the present invention is the arrangement of the reflective film-coated glass 20 at the front side and the arrangement of the reflector 40 at the rear side such that when the LEDs 34 are turned on, the front side is transmissive for emitting light for illumination and provides the visual effect of the aforesaid curved tunnel of light spots. In addition to the functioning to reflect light, the reflector 40 works as a mirror when the LEDs 34 are off As the film-coated glass 20 is light transmissive, it is not clear when used as a mirror. However, subject to the reflective function of the reflector 40 that is arranged at the back side, the user can see the mirror image of his (her) face clearly when standing in front of the LED mirror light assembly, and therefore, the LED mirror light assembly of the invention is practical for use as a mirror.

Thus, subject to the arrangement of the LEDs 34 at the peripheral frame wall 33 of the LED holder 30 between the film-coated glass 20 and the reflector 40 that are arranged in a non-parallel manner, the LED mirror light assembly can be used as a mirror and can provide a visual effect of curved tunnel of light spots.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A LED mirror light assembly, comprising a body comprising a through hole configured subject to a predetermined shape and located on a middle part thereof, and a first step and a second step disposed around said through hole and extending outwardly in a direction from a front side of said body toward a rear side thereof;

a film-coated glass configured subject to a shape of said through hole of said body and supported on said first step, said film-coated glass comprising a transmittance front face and a reflective back face, said film-coated glass being insertable within said through hole of said body for capturing said film-coated glass within said body;

a LED holder set in between said first step and said second step and holding a plurality of light-emitting diodes, said light emitting diodes being mounted on an inner wall of said LED holder, said LED holder comprising a front frame wall, a rear frame wall and a peripheral frame wall connected between said front frame wall and said rear frame wall and holding said light-emitting diodes, said front and rear frame walls forming a through area corresponding to a reflective surface of said film-coated glass; and a reflector having a reflective surface corresponding to the through area of said front and rear frame walls and mounted at said rear frame wall of said LED holder, said reflector comprising a reflective surface located on a front side thereof and facing toward said light-emitting diodes and a light-shading coating coated on a rear side thereof, said reflector being kept in a non-parallel manner relative to said film-coated glass and defining with said film-coated glass a predetermined contained angle for reflecting the light spots of said light-emitting diodes in a repeatedly reflected manner by said reflective back face of said film-coated glass and said reflective surface of said reflector thereby forming a curved tunnel of light spots;

wherein said front frame wall and said rear frame wall of said LED holder are arranged in a non-parallel manner and define therebetween said predetermined contained angle so that said reflector and said film-coated glass are kept in a non-parallel manner defining said predetermined contained angle therebetween.

2. The LED mirror light assembly as claimed in claim 1, wherein said body further comprises a backboard arranged at said second step and attached to the rear side of said reflector.

3. The LED mirror light assembly as claimed in claim 1, wherein said body further comprises a base and a power cord.

* * * * *